United States Patent [19]
Kim

[11] Patent Number: 5,945,259
[45] Date of Patent: Aug. 31, 1999

[54] METHOD FOR LEAD FRAME ETCHING

[75] Inventor: Yung-joon Kim, Yongin, Rep. of Korea

[73] Assignee: Samsung Aerospace Industries, Ltd., Changwon-si, Rep. of Korea

[21] Appl. No.: 09/025,260

[22] Filed: Feb. 18, 1998

[30] Foreign Application Priority Data

May 12, 1997 [KR] Rep. of Korea ...................... 97-18330

[51] Int. Cl.$^6$ .................. G03F 7/00; H01L 21/48
[52] U.S. Cl. .................. 430/316; 430/312; 430/323; 216/14; 216/17; 216/47
[58] Field of Search ................. 430/313, 312, 430/316, 323, 961; 216/14, 46, 17, 41, 47, 72

[56] References Cited

U.S. PATENT DOCUMENTS

| | | | |
|---|---|---|---|
| 5,652,084 | 7/1997 | Cleeves | 430/315 |
| 5,667,940 | 9/1997 | Hsue et al. | 430/312 |
| 5,683,943 | 11/1997 | Yamada | 437/220 |

*Primary Examiner*—Janet Baxter
*Assistant Examiner*—Jill N. Holloman
*Attorney, Agent, or Firm*—Howrey & Simon

[57] ABSTRACT

A lead frame etching method, which is used for a semiconductor device assembling process and prevents a sharp-edged portion formed on each lateral end of a lead frame material. The method includes the steps of forming a first photoresist pattern defining the actual etching region, on both surfaces of a lead frame material, forming a second photoresist pattern as an etching buffer extending from lateral ends of the first photoresist pattern, on both surfaces of the lead frame material on which the first photoresist pattern is formed, etching the lead frame material using the second photoresist pattern as an etching mask, removing the second photoresist pattern from the etched lead frame material, etching the lead frame material using the first photoresist pattern as an etching mask, and removing the first photoresist pattern from the twice-etched lead frame material.

9 Claims, 2 Drawing Sheets

METHOD FOR LEAD FRAME ETCHING

BACKGROUND OF THE INVENTION

1. Field of the Invention

The present invention relates to a lead frame which is used in a semiconductor device assembly process, and more particularly, to a method of etching the lead frame.

2. Description of the Related Art

A typical lead frame, which is used in a semiconductor device assembly process, is one of the core component materials for a semiconductor package. The lead frame serves as a lead for connecting the interior and exterior of the semiconductor package to one another, and as a supporting member for a semiconductor chip. The lead frame is comprised of a chip pad for loading a chip thereon, an inner lead, and an outer lead. A lead frame fabricating method is largely divided into a stamping process and an etching process. The stamping process fabricates a lead frame having a predetermined pattern by pressing a substrate and forming a certain shape while sequentially transferring the substrate using a sequential transfer press molding device. This method is advantageous for mass production, but requires a large initial investment on the mold fabrication and it takes as long as about six to ten months to make a mold. Therefore, the etching process has been adopted for multi-species production in small quantities. The etching process fabricates a lead frame of a desired pattern by exposure to light, development, and etching after forming a photoresist layer on either surface of a substrate. The etching process is suitable for the formation of a fine pattern, and does not take long to process. However, the etching process has drawbacks in terms of high cost and suitability for mass production.

A lead frame fabricating method using a typical etching process includes the steps of pretreating a lead frame material after completing the design of a lead frame, coating a photoresist, exposing to light, developing, etching, peeling, plating, and taping as post-processing steps.

FIG. 1 illustrates a conventional method of etching a lead frame. Referring to FIG. 1, a photoresist pattern 3 is formed on both surfaces of a lead frame material 1, and the lead frame material 1 is etched using the photoresist pattern 3 as an etching mask. In fabricating a lead frame having a minute pattern, the lateral ends of the lead frame material are overetched during the etching process, thereby generating an undercut nonlinear portion 5. The nonlinear portion 5 has been a serious obstacle in fabricating a lead frame requiring an accurate size.

Also, the nonlinear portion 5 impedes a subsequent silver plating on the tip of the inner lead or chip pad, or plating of an alloy of tin (Sn) and lead (Pb) on the external lead in a packaging process. That is, the conventional method has a drawback in that the thickness of a material plated on the surface of the lead frame is not uniform.

SUMMARY OF THE INVENTION

It is an object of the present invention to provide a lead frame etching method in which a lead frame is accurately fabricated and the formation of a nonlinear portion on either side of the lead frame is avoided by improving a method of etching a lead frame material, and in which the thickness of a material plated on the surface of the lead frame is uniform.

To accomplish the above object, a lead frame etching method comprises the steps of forming a first photoresist pattern on both surfaces of a lead frame material, forming a second photoresist pattern as an etching buffer extending from lateral ends of the first photoresist pattern, on both surfaces of the lead frame material on which the first photoresist pattern is formed, etching the lead frame material using the second photoresist pattern as an etching mask, removing the second photoresist pattern from the etched lead frame material, etching the lead frame material using the first photoresist pattern as an etching mask, and removing the first photoresist pattern from the second-etched lead frame material. The etching depth is equal to the thickness of the first photoresist pattern.

It is preferable that the lead frame material is formed of at least one metal selected from the group consisting of copper (Cu), iron (Fe) and nickel (Ni). Preferably, a sodium hydroxide (NaOH) solution is used as a peeling solution to remove the first and second photoresist patterns, and the first and second etching processes are performed using an iron chloride ($FeCl_3$) solution as an etchant.

Preferably, the sodium hydroxide (NaOH) solution for removing the first photoresist pattern has a different acidity from that for removing the second photoresist pattern. It is preferable that each of the first and second photoresist patterns is formed of a casein or a dry film having a different peeling characteristic depending on the acidity of the sodium hydroxide (NaOH) solution.

Also, it is preferable that the width of the second photoresist pattern is between 20 and 50% of the thickness of the lead frame material, and that the first photoresist pattern exposes a region to be finally etched out.

BRIEF DESCRIPTION OF THE DRAWINGS

The above object and advantages of the present invention will become more apparent by describing in detail a preferred embodiment thereof with reference to the attached drawings in which.

DETAILED DESCRIPTION OF THE INVENTION

Figure 1:
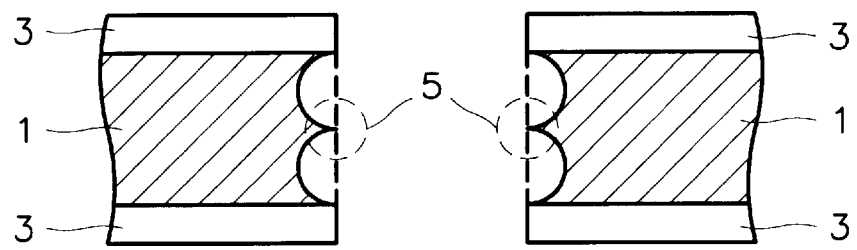
FIG. 1 is a sectional view illustrating a conventional method of etching a lead frame.
Figure 2:
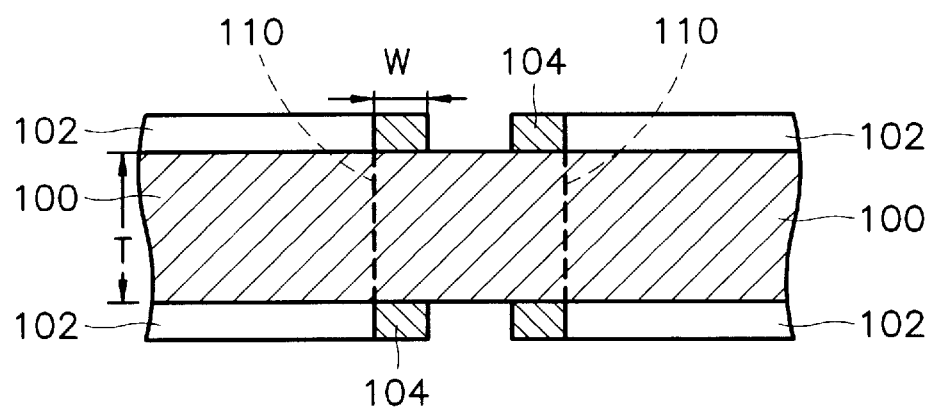
FIGS. 2 to 5 are sectional views illustrating a method of etching a lead frame according to the present invention.

Referring to FIG. 2, a first photoresist film is coated on both surfaces of a lead frame material 100 which at least contains a metal selected from copper (Cu), iron (Fe), and nickel (Ni). The first photoresist film undergoes a developing process to form a first photoresist pattern 102. Next, a second photoresist film is coated on both surfaces of the lead frame material 100 having the first photoresist pattern 102 formed on both of its surfaces. The second photoresist film undergoes a developing process, thereby forming a second photoresist pattern 104 which extends from the lateral end of the first photoresist pattern 102 and has a predetermined width W. The first and second photoresist patterns 102 and 104 have a different peeling characteristic. Accordingly, it is preferable that a casein or a dry film is used as the first and second photoresist patterns, since the peeling characteristic of casein or dry film depends on the acidity of a peeling solution such as sodium hydroxide (NaOH) solution. Also, it is preferable that the width W of the second photoresist pattern is between 20 and 50% of the thickness T of the lead frame material, since the second photoresist pattern 104 having the above preferable width W effectively functions as an etching buffer to avoid an undercut on the lateral ends of the lead frame material 100 during a subsequent etching process. In the preferred embodiment of present invention, the width W of the second photoresist pattern is 30% of the thickness T of the lead frame material. Here, the first photoresist pattern 102 exposes only a region to be finally etched out. Dotted lines 110 in FIG. 2 represent an ideal profile to be produced by the etching.

Figure 3:
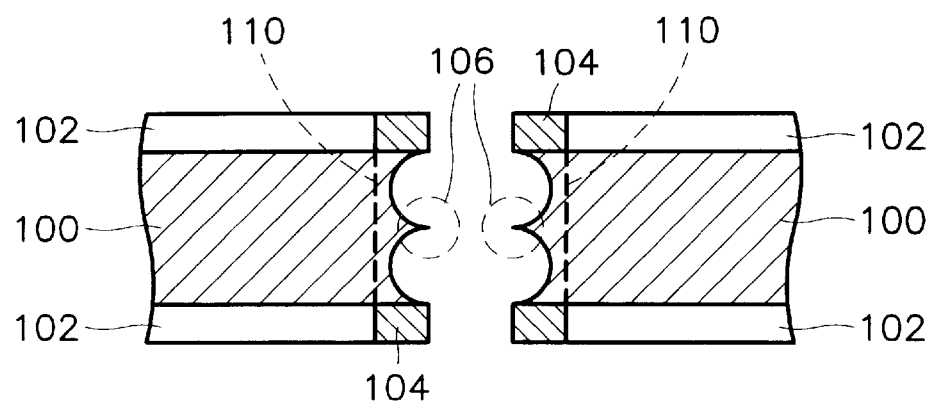

Referring to FIG. 3, the lower lead frame material 100 on which the first and second photoresist patterns 102 and 104 are formed, is etched using an iron chloride ($FeCl_3$) solution as an etching solution and the first and second photoresist patterns 102 and 104 as an etching mask. A wet etching process is suitable for etching and a sharp-edged portion 106 is formed on each side of the lead frame material 100 as in the conventional method.

Figure 4:
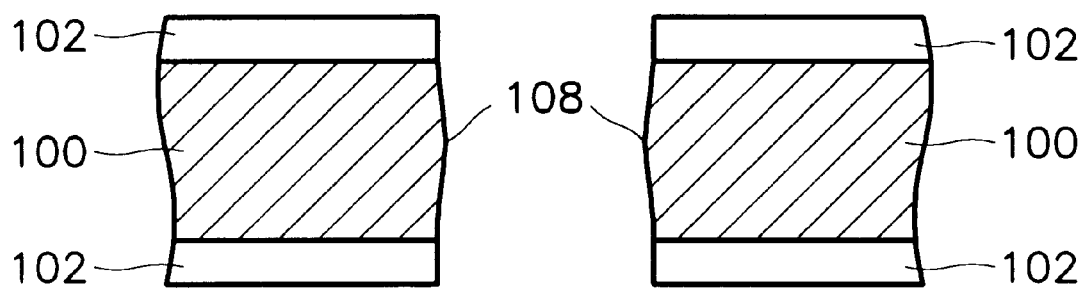

Referring to FIG. 4, the second photoresist pattern 104 is removed from the first-etched lead frame material 100. The composition of the second photoresist pattern 104, the casein or the dry film, is controlled to be different from that of the first photoresist pattern 102. Accordingly, the casein or the dry film has a different peeling characteristic depending on the acidity of the sodium hydroxide (NaOH) solution used as the peeling solution. Therefore, only the second photoresist pattern 104 can be selectively removed by controlling the acidity of the sodium hydroxide (NaOH) solution. In the preferred embodiment of present invention, the second photoresist pattern 104 is removed by the sodium hydroxide (NaOH) solution of pH 11. Then, a second etching process is conducted using the first photoresist pattern 102 as an etching mask and the iron chloride ($FeCl_3$) as an etching solution. Consequently, the sharp-edged portions 106 on both lateral ends of the lead frame material are removed and a final etched section 108 is formed, which is nearly a level surface. Since the first etching process has already pierced the section of the lead frame material 100, the second etching process removes the sharp-edged portion 106 that was formed on either lateral end of the lead frame material due to an undercut. Thus, the final profile of the etched section 108 approaches a straight line. The first photoresist pattern 102 was formed to expose the finally-etched region, so that the final profile of the etched section 108 approximates a straight line. Thus, a lead frame of accurate dimensions is fabricated without the sharp-edged portion on the lateral end of the lead frame, which was a problem in the prior art.

Figure 5:
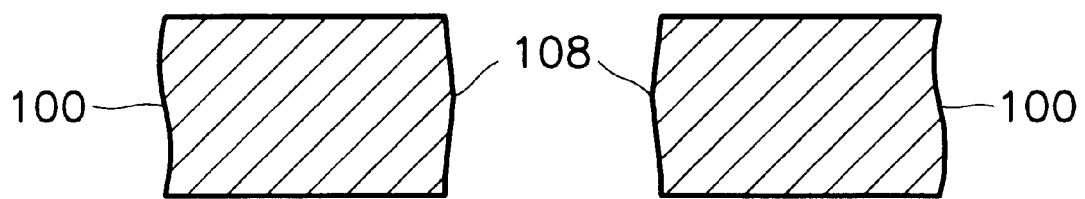

FIG. 5 is a sectional view of the second-etched lead frame material 100 from which the first photoresist pattern 102 is peeled. At this time, the acidity of the sodium hydroxide (NaOH) solution used as a peeling solution is pH 12, different from that used to remove the second photoresist pattern 104. Therefore, the lead frame etching process according to the present invention is completed by finally removing the first photoresist pattern 102 which is selectively peeled according to the acidity of the peeling solution.

According to the present invention described above, a lead frame of a precise dimension can be fabricated without the effect of an undercut by etching the lead frame material twice. Simultaneously, the surface of the lead frame can be plated with a consistent thickness by removing the sharp-edged portion formed on the lateral end of the lead frame material.

The present invention is not limited to the above embodiment, and it is apparent that various modifications may be effected by those skilled in the art within the spirit of the present invention.

What is claimed is:

1. A lead frame etching method comprising the steps of:

forming a first photoresist pattern on both surfaces of a lead frame material;

forming a second photoresist pattern as an etching buffer extending from lateral ends of said first photoresist pattern, on both surfaces of said lead frame material on which said first photoresist pattern is formed;

etching said lead frame material using said first and second photoresist patterns as an etching mask;

removing said second photoresist pattern from said first-etched lead frame material;

etching said lead frame material using said first photoresist pattern as an etching mask; and removing said first photoresist pattern from said twice-etched lead frame material.

2. The method according to claim 1, wherein said etchings are performed using an iron chloride ($FeCl_3$) solution as an etchant.

3. The method according to claim 1, wherein a sodium hydroxide (NaOH) solution is used as a peeling solution to remove said first and second photoresist patterns.

4. The method according to claim 3, wherein said sodium hydroxide (NaOH) solution for removing said first photoresist pattern has a different acidity than that for removing said second photoresist pattern.

5. The method according to claim 3, wherein each of said first and second photoresist patterns is formed of a material having a different peeling characteristic depending on the acidity of said sodium hydroxide (NaOH) solution.

6. The method according to claim 5, wherein said first and second photoresist patterns each having a different peeling characteristic is formed of a casein or a dry film.

7. The method according to claim 1, wherein the width of said second photoresist pattern is between 20 and 50% of the thickness of said lead frame material.

8. The method according to claim 1, wherein said first photoresist pattern exposes a region to be finally etched out.

9. The method according to claim 1, wherein said lead frame material is formed of at least a metal selected from the group consisting of copper (Cu), iron (Fe), and nickel (Ni).

* * * * *